United States Patent
Freitag et al.

(10) Patent No.: US 10,950,260 B1
(45) Date of Patent: Mar. 16, 2021

(54) MAGNETORESISTIVE SENSOR WITH IMPROVED MAGNETIC PROPERTIES AND MAGNETOSTRICTION CONTROL

(71) Applicant: Western Digital Technologies, Inc., San Jose, CA (US)

(72) Inventors: James Mac Freitag, Sunnyvale, CA (US); Zheng Gao, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/851,568

(22) Filed: Apr. 17, 2020

(51) Int. Cl.
| | |
|---|---|
| *G11B 5/39* | (2006.01) |
| *G01D 5/16* | (2006.01) |
| *H01F 10/32* | (2006.01) |
| *H01L 43/10* | (2006.01) |
| *H01L 43/02* | (2006.01) |

(52) U.S. Cl.
CPC .............. *G11B 5/3909* (2013.01); *G01D 5/16* (2013.01); *G11B 5/3906* (2013.01); *H01F 10/3254* (2013.01); *H01L 43/02* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 6,870,716 B2 | 3/2005 | Gill | |
| 7,007,373 B2 | 3/2006 | Kula et al. | |
| 7,141,314 B2 | 11/2006 | Zhang et al. | |
| 7,751,156 B2 | 7/2010 | Mauri et al. | |
| 7,830,641 B2 | 11/2010 | Lin | |
| 8,194,365 B1 | 6/2012 | Leng et al. | |
| 8,385,027 B2 | 2/2013 | Zhao et al. | |
| 8,456,781 B2 | 6/2013 | Zhao et al. | |
| 8,498,084 B1 | 7/2013 | Leng et al. | |
| 8,747,629 B2 | 6/2014 | Wang et al. | |
| 8,817,426 B2* | 8/2014 | Gao ...................... | G11B 5/3909 360/324.11 |
| 8,946,834 B2 | 2/2015 | Wang et al. | |
| 8,947,835 B2* | 2/2015 | Lin ...................... | G11B 5/3163 360/324.12 |
| 9,070,381 B1* | 6/2015 | Yang .................... | G11B 5/3906 |
| 9,177,575 B1 | 11/2015 | Gao et al. | |

(Continued)

FOREIGN PATENT DOCUMENTS

GB    2537999 A    11/2016

OTHER PUBLICATIONS

Z. Diao ey all.; "Advanced Dual Free Layer CPP GMR Sensors for High Density Magnetic Recording", IEEE Transactions on Magnetics; https://ieeexplore.ieee.org/document/7395363, Oct. 20, 2015 (13 pages).

*Primary Examiner* — Jefferson A Evans
(74) *Attorney, Agent, or Firm* — Patterson & Sheridan, LLP; Steven H. Versteeg

(57) ABSTRACT

A free layer comprising a bilayer (e.g., a first and a second layer) with an amorphous insertion layer in between the bilayer. The free layer includes a ferromagnetic nanolayer between the bilayer and a barrier layer. The magnetostriction of the free layer is tunable by varying the thicknesses of each of the first and the second layers. The free layer can be part of a magnetoresistive device with a reference layer or with another free layer.

20 Claims, 9 Drawing Sheets

(56) References Cited

U.S. PATENT DOCUMENTS

| | | | |
|---|---|---|---|
| 9,293,159 B2 | 3/2016 | Jung et al. | |
| 9,831,419 B2 | 11/2017 | Freitag et al. | |
| 9,842,988 B2 * | 12/2017 | Liu | H01F 10/3295 |
| 2006/0114621 A1 | 6/2006 | Wang et al. | |
| 2006/0152861 A1 | 7/2006 | Zhao et al. | |
| 2007/0035890 A1 | 2/2007 | Sbiaa | |
| 2008/0112093 A1 | 5/2008 | Sato et al. | |
| 2009/0155629 A1 | 6/2009 | Gill | |
| 2010/0073827 A1 * | 3/2010 | Zhao | G11B 5/3909 360/324.2 |
| 2012/0127603 A1 * | 5/2012 | Gao | G11B 5/3909 360/75 |
| 2013/0270523 A1 | 10/2013 | Wang et al. | |
| 2014/0355152 A1 * | 12/2014 | Park | G11B 5/3909 360/75 |
| 2015/0311430 A1 * | 10/2015 | Singleton | G11B 5/3906 257/421 |
| 2017/0018703 A1 * | 1/2017 | Freitag | G11B 5/3948 |

\* cited by examiner

MAGNETORESISTIVE SENSOR WITH IMPROVED MAGNETIC PROPERTIES AND MAGNETOSTRICTION CONTROL

BACKGROUND OF THE DISCLOSURE

Field of the Disclosure

Embodiments of the present disclosure generally relate to a magnetoresistive device, such as a read sensor of a read head of a data storage device.

Description of the Related Art

The heart of the functioning and capability of a computer is the storing and writing of data to a data storage device, such as a hard disk drive (HDD). The volume of data processed by a computer is increasing rapidly. There is a need for higher recording density of a magnetic recording medium to increase the function and the capability of a computer.

In order to achieve higher recording densities, such as recording densities exceeding 2 Tbit/in2 for a magnetic recording medium, the width and pitch of write tracks are narrowed, and thus the corresponding magnetically recorded bits encoded in each write track are narrowed. Attempts to achieve increasing requirements of advanced narrow gap reader sensors of read heads to achieve reading of higher recording densities have proposed utilizing magnetoresistive sensors with free layers comprised of high saturation magnetization materials such as CoFe alloys or a combination of CoFe and an amorphous alloy of CoFe and boron. These magnetoresistive sensors may not adequately read high density media or may not be adequately reliable. These magnetoresistive sensors suffer from low magnetoresistive signal, high coercivities of the free layers, high magnetostriction, magnetic or thermal instability, and/or film delamination. Therefore, there is a need for an improved magnetoresistive device.

SUMMARY OF THE DISCLOSURE

The present disclosure generally relates to a magnetoresistive device, such as a read sensor of a read head of a data storage device.

In one embodiment, a magnetoresistive device includes a barrier layer, a free layer, and a capping layer. The free layer is on the barrier layer. The free layer includes a ferromagnetic nanolayer, a first layer, an amorphous insertion layer, a second layer. The ferromagnetic nanolayer is on the barrier layer. The first layer is proximate the barrier layer and is on or over the ferromagnetic nanolayer. The amorphous insertion layer is between the first layer and the second layer. The second layer is away from the barrier layer and on the amorphous insertion layer. Each of the first layer and the second layer independently comprises a material selection from CoFeB and CoB. The first layer has a thickness from about 0.1 times to about 10 times a thickness of the second layer. The capping layer comprises a non-ferromagnetic material is over the free layer.

In another embodiment, a magnetoresistive device includes a seed layer, a buffer layer, a first free layer, a barrier layer, and a second free layer. The buffer layer is over the seed layer. The first free layer is over the buffer layer. The barrier layer is over the first free layer. The second free layer is over the barrier layer. Each of the first free layer and the second free layer independently comprises a ferromagnetic nanolayer, a first layer, an insertion layer, and a second layer. Each of the ferromagnetic nanolayers is adjacent the barrier layer. Each of the first layers is proximate the barrier layer. Each of the insertion layers is between the first layer and the second layer. Each of the second layers is away from the barrier layer and on the insertion layer. Each of the first layers independently has a thickness from about 0.1 times to about 10 times a thickness of the respective second layer. Each of the first layer and the second layer of each of the first free layer and the second free layer independently comprises a material selected from CoFeB and CoB.

In still another embodiment, a magnetoresistive device includes a MgO barrier layer, a free layer, and a capping layer. The free layer is over the MgO barrier layer. The free layer includes a CoFe nanolayer, a first layer, a CoHf insertion layer, and a second layer. The CoFe nanolayer is on the MgO barrier layer. The first layer proximate is on the CoFe nanolayer. The CoHf insertion layer is between the first layer and the second layer. The second layer is on the CoHf insertion layer. The capping layer is on the free layer. Each of the first layer and the second layer independently comprises a material selected from CoFeB and CoB. The first layer has a thickness from about 0.1 times to about 10 times a thickness of the second layer. The free layer has a thickness of about 100 Å or less.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s). Usage in the Summary of the Disclosure or in the Detailed Description of the term "comprising" shall mean comprising, consisting essentially, and/or consisting of.

Due to a narrow read gap of a read sensor, the thickness of a free layer of the read sensor is limited to a certain dimension. A free layer comprising a bilayer (e.g., a first and a second CoFeB layer) with an amorphous insertion layer in between the bilayer provides a desirable high magnetic moment and a desirable low coercivity. To increase the tunnel magnetoresistance and further increase the magnetic moment of the free layer, the free layer includes a ferromagnetic nanolayer between the bilayer and a barrier layer. The magnetostriction of the free layer is tunable by varying the thicknesses of each of the first and the second CoFeB layers. For example, a free layer with low or no magnetostriction contributes to a read sensor with high SNR and/or with high reliability.

Figure 1:
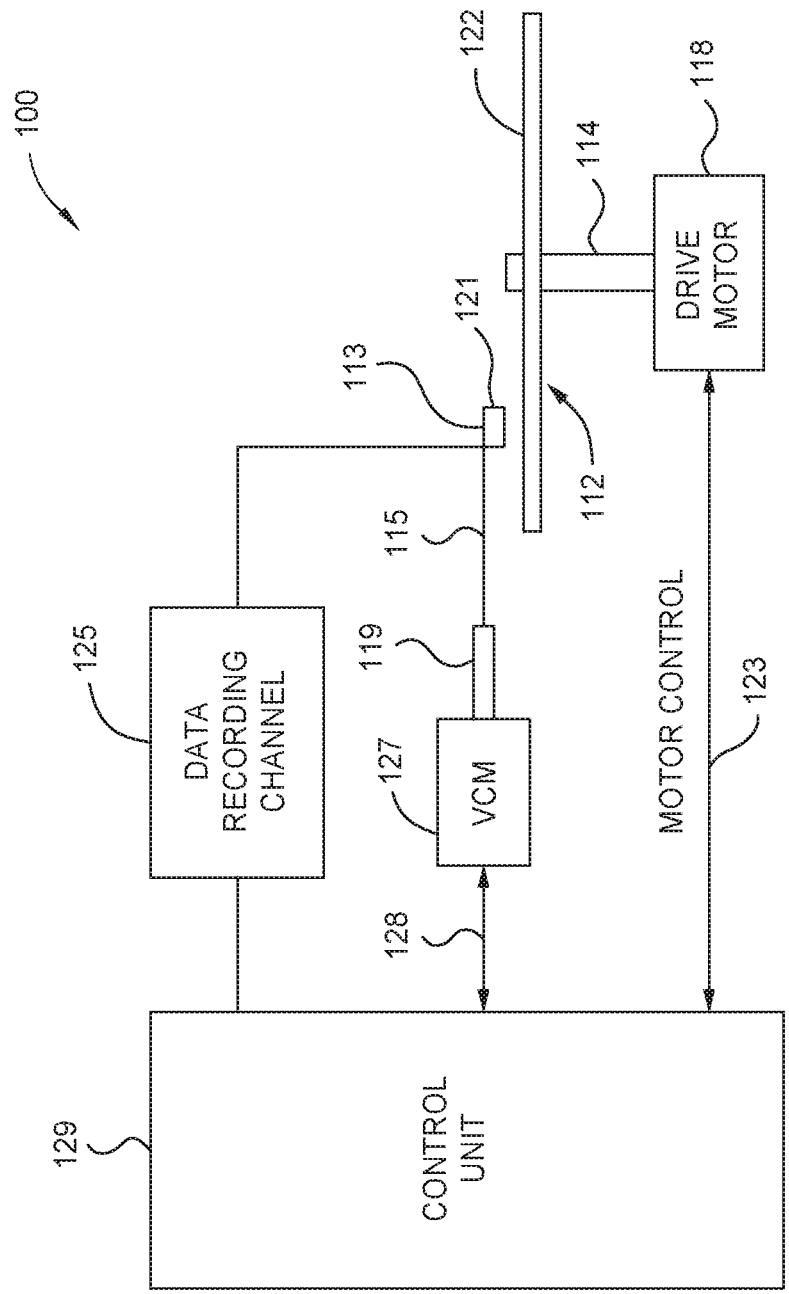
FIG. 1 is a schematic illustration of certain embodiments of a magnetic media drive including a magnetic read head.

FIG. 1 is a schematic illustration of certain embodiments of a magnetic media drive 100 including a magnetic write head and a magnetic read head. The magnetic media drive 100 may be a single drive/device or comprise multiple drives/devices. The magnetic media drive 100 includes a magnetic recording medium, such as one or more rotatable magnetic disk 112 supported on a spindle 114 and rotated by a drive motor 118. For the ease of illustration, a single disk drive is shown according to one embodiment. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112. Each slider 113 supports a head assembly 121 including one or more read/write heads, such as a write head and such as a read head comprising a TMR device. As the magnetic disk 112 rotates, the slider 113 moves radially in and out over the disk surface 122 so that the head assembly 121 may access different tracks of the magnetic disk 112 where desired data are written or read. Each slider 113 is attached to an actuator arm 119 by way of a suspension 115. The suspension 115 provides a slight spring force which biases the slider 113 toward the disk surface 122. Each actuator arm 119 is attached to an actuator 127. The actuator 127 as shown in FIG. 1 may be a voice coil motor (VCM). The VCM includes a coil movable within a fixed magnetic field, the direction and speed of the coil movements being controlled by the motor current signals supplied by control unit 129.

During operation of the magnetic media drive 100, the rotation of the magnetic disk 112 generates an air or gas bearing between the slider 113 and the disk surface 122 which exerts an upward force or lift on the slider 113. The air or gas bearing thus counter-balances the slight spring force of suspension 115 and supports slider 113 off and slightly above the disk surface 122 by a small, substantially constant spacing during normal operation.

The various components of the magnetic media drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from the head assembly 121 by way of recording channel 125. Certain embodiments of a magnetic media drive of FIG. 1 may further include a plurality of media, or disks, a plurality of actuators, and/or a plurality number of sliders.

Figure 2:
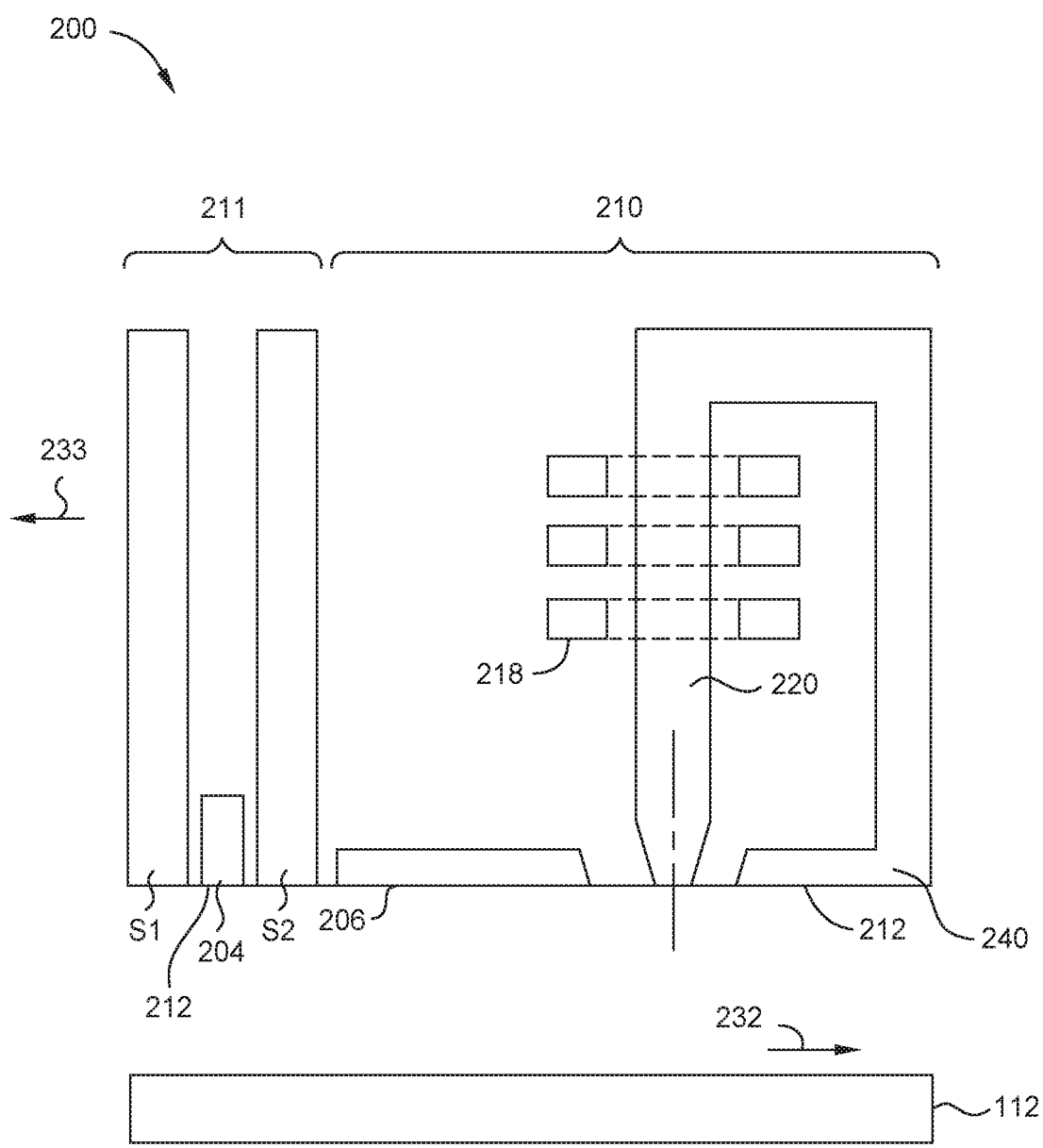
FIG. 2 is a schematic illustration of certain embodiments of a cross sectional side view of a head assembly facing a magnetic storage medium.

FIG. 2 is a schematic illustration of certain embodiments of a cross sectional side view of a head assembly 200 facing the magnetic disk 112 or other magnetic storage medium. The head assembly 200 may correspond to the head assembly 121 described in FIG. 1. The head assembly 200 includes a media facing surface (MFS) 212 facing the magnetic disk 112. As shown in FIG. 2, the magnetic disk 112 relatively moves in the direction indicated by the arrow 232 and the head assembly 200 relatively moves in the direction indicated by the arrow 233.

The head assembly 200 includes a magnetic read head 211. The magnetic read head 211 include a sensing element 204 disposed between shields S1 and S2. The sensing element 204 and the shields S1 and S2 having a MFS 212 facing the magnetic disk 112. The sensing element 204 is a TMR device sensing the magnetic fields of the recorded bits, such as perpendicular recorded bits or longitudinal recorded bits, in the magnetic disk 112 by a TMR effect. In certain embodiments, the spacing between shields S1 and S2 is about 17 nm or less.

The head assembly 200 may optionally include a write head 210. The write head 210 includes a main pole 220, a leading shield 206, and a trailing shield (TS) 240. The main pole 220 comprises a magnetic material and serves as a main electrode. Each of the main pole 220, the leading shield 206, and the trailing shield (TS) 240 has a front portion at the MFS. The write head 210 includes a coil 218 around the main pole 220 that excites the main pole 220 producing a writing magnetic field for affecting a magnetic recording medium of the rotatable magnetic disk 112. The coil 218 may be a helical structure or one or more sets of pancake structures. The TS 240 comprises a magnetic material, serving as a return pole for the main pole 220. The leading shield 206 may provide electromagnetic shielding and is separated from the main pole 220 by a leading gap 254.

Figure 3A:
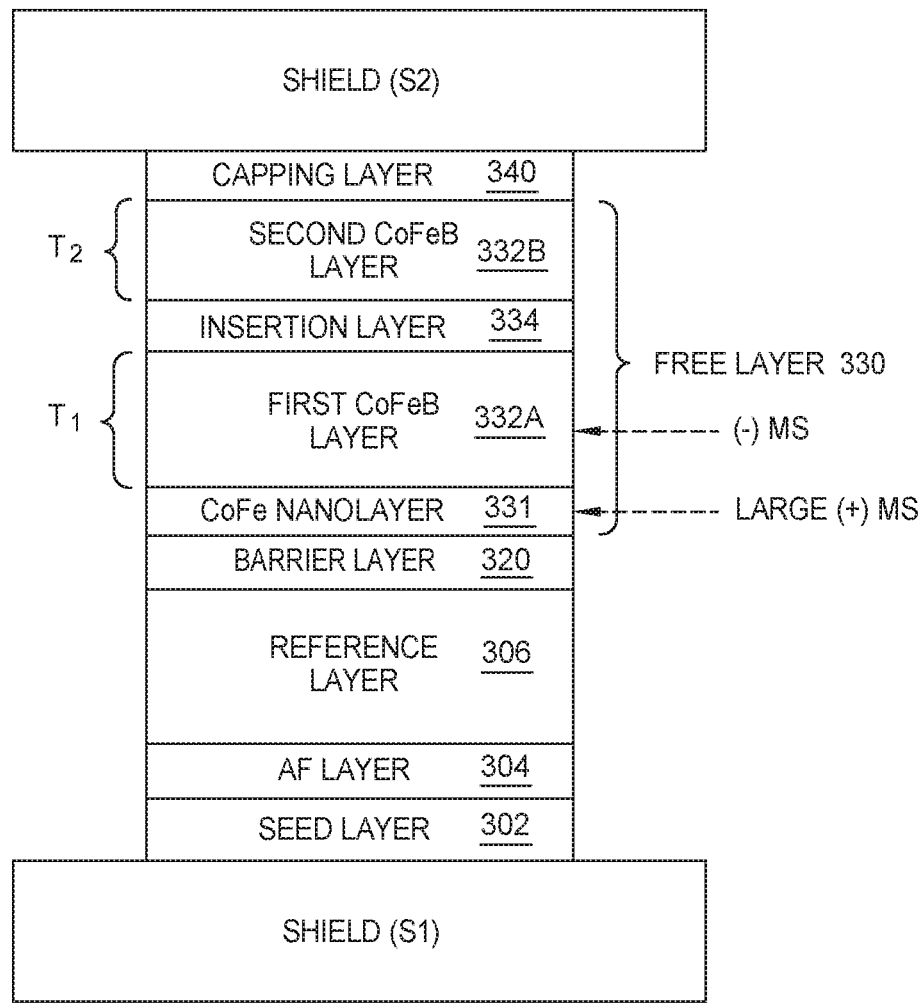
FIGS. 3A-B are schematic illustrations of certain embodiments of a media facing surface (MFS) of a magnetoresistive device comprises a reference layer and a free layer.

FIG. 3A is a schematic illustration of certain embodiments of a MFS of a magnetoresistive device 300 between shields S1 and S2 of a magnetic read head, such as the magnetic read head 211 of FIG. 2 or other magnetic read heads. The magnetoresistive device 300 comprises a reference layer 306, a barrier layer 320 over the reference layer 306, and a free layer 330 over the barrier layer 320.

In certain embodiments, the magnetoresistive device 300 can be fabricated by forming a seed layer 302, over a lower shield S1. An antiferromagnetic (AFM) pinning layer 304 is formed over the seed layer 302. The reference layer 306 is formed over the AFM pinning layer 304. The barrier layer 320 is formed over the reference layer 306. The free layer 330 is formed over the barrier layer 320. A capping layer 340 is formed over the free layer 330. An upper shield S2 is formed over the capping layer 340.

The free layer 330 comprises a ferromagnetic nanolayer 331 on the barrier layer 320, a bilayer 332A-B over the ferromagnetic nanolayer 331, and an amorphous insertion layer 334 in between the bilayer 332A-B.

The ferromagnetic nanolayer 331 interfaces with the barrier layer 320 and promotes the crystalline texture of the barrier layer 320, such as a barrier layer comprising MgO with (001) crystalline texture. In certain embodiments, the ferromagnetic nanolayer 331 has a thickness from about 1 Å to about 10 Å.

In certain embodiments, the ferromagnetic nanolayer 331 comprises CoFe with an atomic percent content of Fe from about 20% to about 80%. In certain embodiments, the ferromagnetic nanolayer 331 comprises CoFe with an atomic percent content of Fe from about 50% to about 70% so that a tunneling magnetoresistive (TMR) of the magnetoresistive device is higher than a magnetoresistive device with a CoFe ferromagnetic nanolayer having an atomic percent content of Fe of less than 50%. A CoFe ferromagnetic nanolayer 331 has a positive magnetostriction. A higher the atomic percent content of Fe of the CoFe ferromagnetic nanolayer 331 increases the positive magnetostriction of the CoFe ferromagnetic nanolayer 331.

The bilayer 332A-B comprises a first cobalt iron boron (CoFeB) layer 332A proximate the barrier layer 320 and a second CoFeB layer 332B away from the barrier layer 320. The first CoFeB layer 332A is over the ferromagnetic nanolayer 331, the amorphous insertion layer 334 is over the first CoFeB layer 332A, and the second CoFeB layer 332B is over the amorphous insertion layer 334. Each of the first CoFeB layer 332A and the second CoFeB layer 332B independently comprises Fe in an atomic percent content of about 60% or less, such as from 0% to about 60%, and B in an atomic percent content from about 5% to about 50%.

Magnetostriction of the free layer 330 of the magnetoresistive device 300 is due to the magnetic coupling of sub-layers of the free layer 330, the texture of the sub-layers of the free layer 330, and/or the materials of the sub-layers of the free layer 330. The first CoFeB layer 332A has a thickness T1 different from a thickness T2 of the second CoFeB layer 332B to control the magnetostriction of the free layer 330. In certain embodiments, the first CoFeB layer 332A has a thickness T1 from about 0.1 times to about 10 times a thickness T2 of the second CoFeB layer 332B.

Figure 3B:
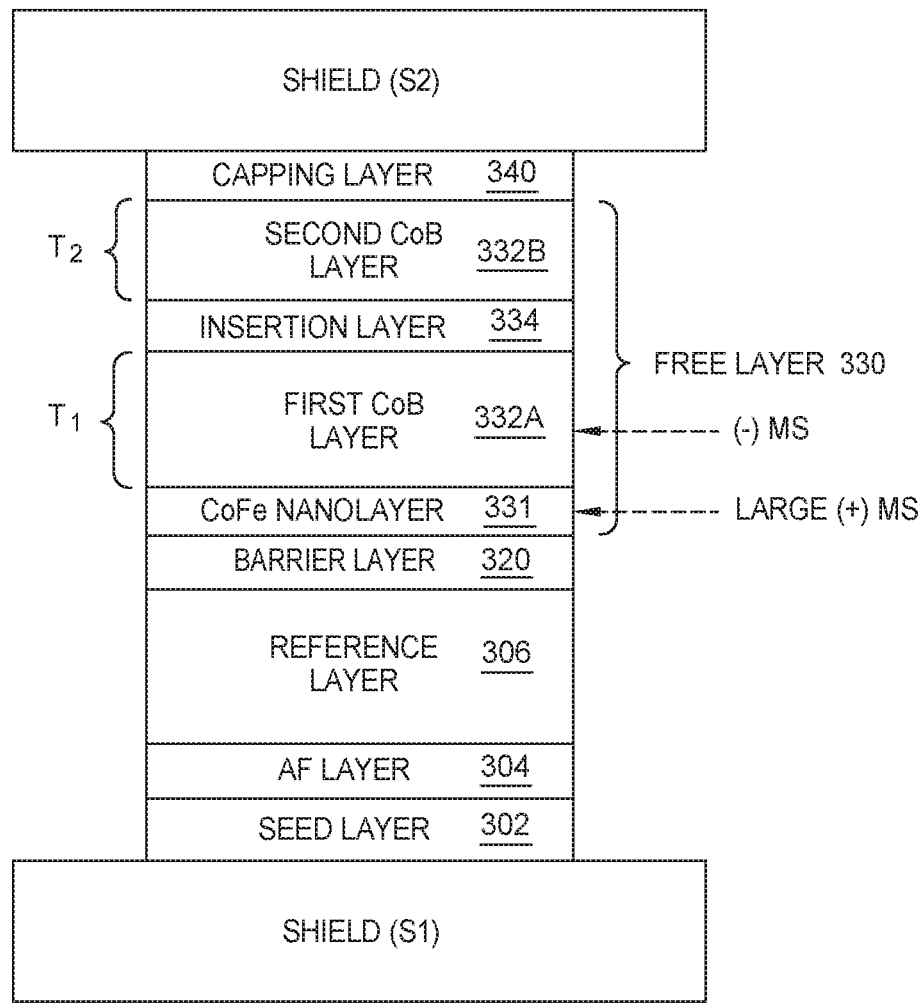

In one embodiment as shown in FIG. 3B, the bilayer 332A-B comprises a first cobalt boron (CoB) layer 332A proximate the barrier layer 320 and a second CoB layer 332B away from the barrier layer 320. The first CoB layer 332A is over the ferromagnetic nanolayer 331, the amorphous insertion layer 334 is over the first CoB layer 332A, and the second CoB layer 332B is over the amorphous insertion layer 334. The first CoB layer 332A has a thickness T1 larger than a thickness T2 of the second CoB layer 332B. In certain embodiments, the first CoB layer 332A has a thickness T1 from about 1.5 times to about 3 times larger than a thickness T2 of the second CoB layer 332B. The first CoB layer 332A and the second CoB layer 332B each independently comprises CoB with an atomic percent of B from about 5% to about 50%. The CoB bilayer has low magnetostriction in comparison to other bilayers comprising Fe or Fe alloys, such as FeB or CoFeB. In certain aspects, the low magnetostriction of the CoB bilayer improves the bias point of the sensor and reduces the noise of the magnetoresistive signal providing a higher signal-to-noise ratio (SNR) in comparison to bilayers with high magnetostriction. In certain aspects, the low magnetostriction of the CoB bilayer 332 increases the reliability of the free layer 330 due to reduced deformation and/or delamination of layers in comparison to bilayers with high magnetostriction. The first CoB layer 332A proximate the barrier layer 320 tends to have more negative magnetostriction. Therefore, to further control the magnetostriction of the free layer 330, the thickness T1 of the first CoB layer 332A proximate the barrier layer 320 can be larger than the thickness T2 of the second CoB layer 332B. In certain aspects, the large thickness T1 of the first CoB layer 332A provides a negative magnetostriction to balance out the positive magnetostriction of the CoFe ferromagnetic nanolayer 331 so that the overall magnetostriction of the free layer 330 is low or zero to further increase SNR and/or to further increase reliability.

The amorphous insertion layer 334 breaks up the columnar grains of the bilayer 332A-B reducing the coercivity of the bilayer 332A-B. The amorphous insertion layer 334 comprises CoHf with an atomic percent content of Hf from about 5% to about 95%. In certain embodiments, the amorphous insertion layer 334 comprises ferromagnetic CoHf with an atomic percent content of Hf from about 5% to about 30%. In other embodiments, the amorphous insertion layer 334 is selected from a group consisting of CoHf, CoFeHf, CoFeTa, CoFeB, CoFeBHf, CoFeBTa, Ta, and Hf. In certain embodiments, the amorphous insertion layer 334 is formed to a thickness from about 2 Å to about 20 Å, such as from about 2 Å to about 6 Å.

The seed layer 302 facilitates growth of the AFM pinning layer 304 to grow a microstructure with a strong crystalline texture and to provide a strong antiferromagnetic exchange bias. The seed layer 302 comprises a multiple layer stack of Ta/NiFeCr/NiFe, Ta/NiFe, Ta/Ru, or Ta/Cu or other suitable seed layers. The AFM pinning layer 304 fixes or pins the magnetization direction of the reference layer 306 by exchange-coupling. The AFM pinning layer 304 comprises single or multiple layers of FeMn, NiMn, PtMn, IrMn, PdMn, PtPdMn RhMn, IrMnCr, other AFM materials, and combinations thereof.

The reference layer 306 can comprise a simple pinned layer acting as the reference layer or one or more synthetic antiferromagnetic (SAF) structures. A simple pinned layer is pinned by the AFM pinning layer 304 and acts as a reference layer to the free layer 330. One example of a SAF structure comprises a pinned layer pinned by the AFM pinning layer 304. The pinned layer is antiparallel coupled to a reference layer across an antiparallel (AP) coupling layer. The pinned layer and the AP coupled reference layer comprises single or multiple layers of CoFe, CoB, CoFeB, other ferromagnetic materials, and combinations thereof. The AP coupling layer can comprise Ru, Ir, Rh, Cr, or alloys thereof.

The barrier layer 320 and the capping layer 340 can be any suitable material. For example, the barrier layer 320 can comprise an electrically insulating material of MgO, AlOx, TiOx, or other suitable electrically insulating materials. In certain embodiments, the barrier layer 320 is formed to a thickness of about 10 Å or less. In certain embodiments, the barrier layer is MgO due to the promotion of (001) texture from the CoFe nanolayer 331. For example, the capping layer 340 can comprise a non-magnetic material that separates the free layer 330 from the fixed mixed magnetization of the upper shield S2. Examples of non-magnetic materials include single or multiple layers of a material selected from Ta, Ti, Cr, Ru, Hf, Cu, Ag, and combinations thereof.

Due to a narrow read gap between the shields (S1, S2) to achieve reading of high recording densities, the free layer has a thickness of about 100 Å or less in certain embodiments to form a narrow read gap sensor. A narrow read gap sensor requires a free layer 330 with a high magnetic moment. A free layer of CoFeB has a desirable high magnetic moment and an undesirable high coercivity. The amorphous insertion layer 334 between a bilayer 332A-B provides a desirable high magnetic moment and a desirable low coercivity. To further improve the tunnel magnetoresistance and increase the magnetic moment of the free layer 330, the free layer 330 comprises a ferromagnetic nanolayer 331, such as a CoFe ferromagnetic nanolayer, which undesirably has a high magnetostriction. The magnetostriction of the free layer is tunable by varying the thicknesses of each of the first and the second CoFeB layers 332A-332B. For example, a free layer 330 with low or zero magnetostriction contributes to a read sensor with higher SNR and/or with high reliability.

Figure 4A:
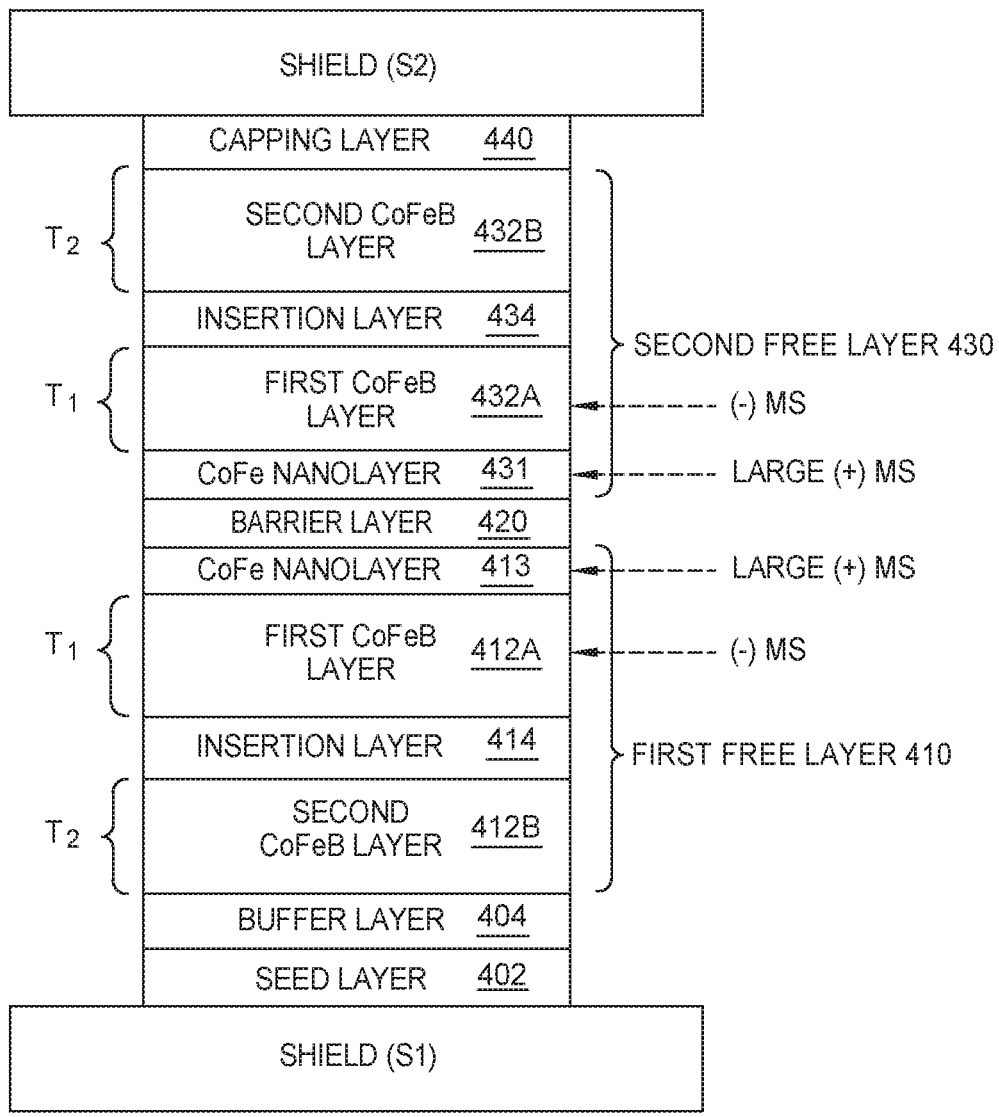
FIGS. 4A-B are schematic illustrations of certain embodiments of a MFS of a magnetoresistive device comprises a dual free layer.

FIG. 4A is a schematic illustration of certain embodiments of a MFS of a magnetoresistive device 400 between shields S1 and S2 of a magnetic read head, such as the magnetic read head 211 of FIG. 2 or other magnetic read heads. The magnetoresistive device 400 comprises a first free layer 410, a barrier layer 420 over the first free layer 410, and a second free layer 430 over the barrier layer 420.

In certain embodiments, the magnetoresistive device 400 can be fabricated by forming a seed layer 402, over a lower shield S1. A buffer layer 404 is formed over the seed layer 402. The first free layer 410 is formed over the buffer layer 404. The barrier layer 420 is formed over the first free layer 410. The second free layer 430 is formed over the barrier layer 420. A capping layer 440 is formed over the second free layer 430. An upper shield S2 is formed over the capping layer 440.

The first free layer 410 and the second free layer 430 each comprises a ferromagnetic nanolayer 413, 431 adjacent the barrier layer 420, a bilayer 412A-B, 432A-B, and an amorphous insertion layer 414, 434 in between the respective bilayer 412A-B, 432A-B.

The ferromagnetic nanolayers 413, 431 interface with the barrier layer 420 and promote the crystalline texture of the barrier layer 420, such as a barrier layer comprising MgO with (001) crystalline texture. In certain embodiments, the ferromagnetic nanolayers 413, 431 each independently has a thickness from about 1 Å to about 10 Å.

In certain embodiments, the ferromagnetic nanolayers 413, 431 each independently comprises CoFe with an atomic percent content of Fe from about 20% to about 80%. In certain embodiments, the ferromagnetic nanolayers 413, 431 each independently comprises CoFe with an atomic percent content of Fe from about 50% to about 70% so that a tunneling magnetoresistive (TMR) of the magnetoresistive device is higher than a magnetoresistive device with CoFe ferromagnetic nanolayers having an atomic percent content of Fe of less than 50%. The CoFe ferromagnetic nanolayers 413, 431 have positive magnetostriction. A higher the atomic percent content of Fe of the CoFe ferromagnetic nanolayers 413, 431 increases the positive magnetostriction of the CoFe ferromagnetic nanolayers 413, 431.

The bilayers 412A-B, 432A-B each comprises a first CoFeB layer 412A, 432A proximate the barrier layer 320 and a second CoFeB layer 412B, 432B away from the barrier layer 420. The ferromagnetic nanolayer 413 of the first free layer 410 is on the first CoFeB layer 412A. The first CoFeB layer 432A of the second free layer 430 is on the ferromagnetic nanolayer 431. The first CoFeB layers 412A, 432A are proximate the barrier layer 420. The second CoFeB layers 412B, 432B are away from the barrier layer 420.

Magnetostriction of the free layers 410, 430 of the magnetoresistive device 400 is due to the magnetic coupling of sub-layers of the free layers 410, 430, the texture of the sub-layers of the free layers 410, 430, and/or the materials of the sub-layers of the free layers 410, 430. The first CoFeB layers 412A, 432A each independently has a thickness T1 different than a thickness T2 of the respective second CoFeB layer 412B, 432B to control the magnetostriction of the respective free layer 310, 330. In certain embodiments, the first CoFeB layers 412, 432A each independently has a thickness T1 from about 0.1 times to about 10 times a thickness T2 of the respective second CoFeB layer 412B, 432B. The first CoFeB layers 412A, 432A and the second CoFeB layers 412B, 432B each independently comprises Fe in an atomic percent of about 60% or less, such as from 0% to about 60%, and B in an atomic percent of B from about 5% to about 50%.

Figure 4B:
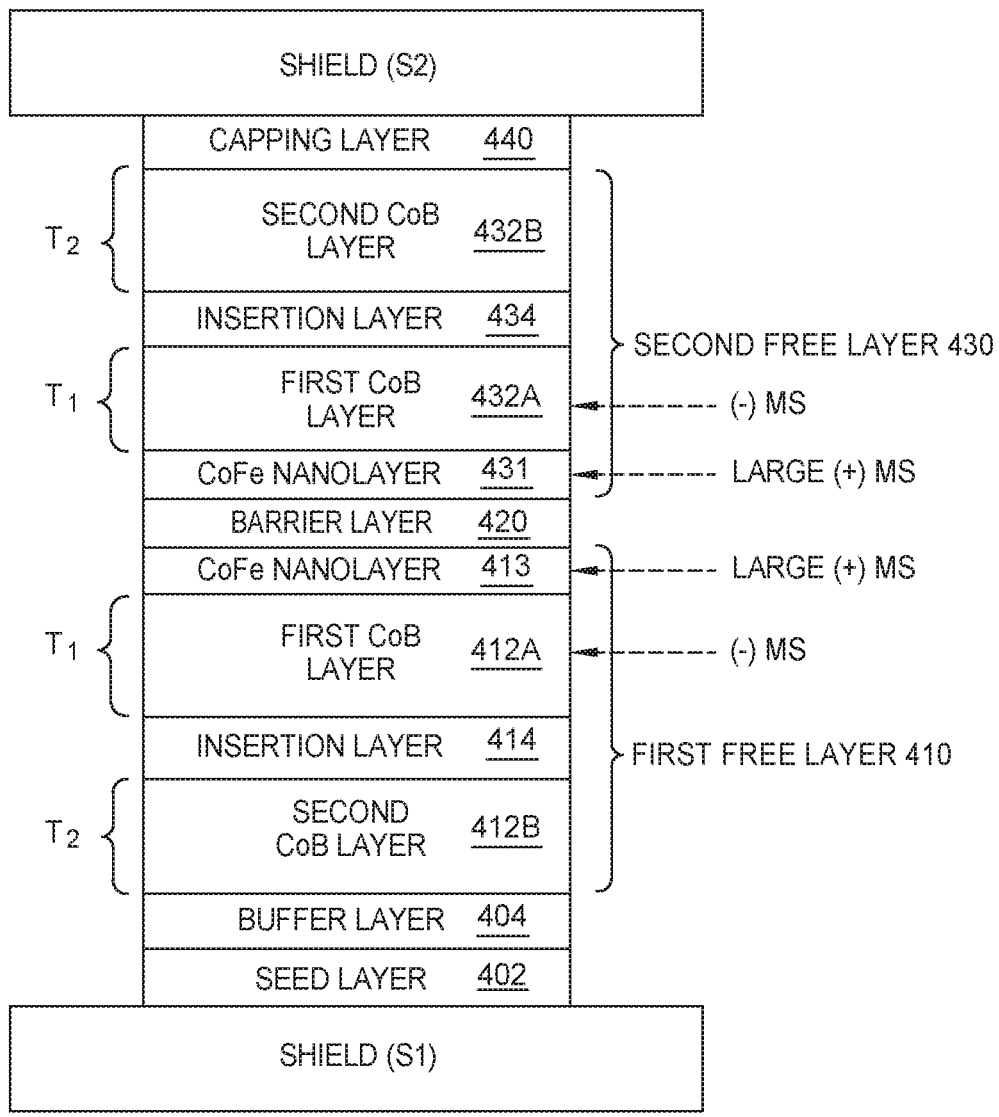

In one embodiment as shown in FIG. 4B, the bilayers 412A-B, 432A-B each comprises a first cobalt boron (CoB) layer 412A, 432A proximate the barrier layer 320 and a second CoB layer 412B, 432B away from the barrier layer 420. The ferromagnetic nanolayer 413 of the first free layer 410 is on the first CoB layer 432A. The first CoB layer 432A of the second free layer 430 is on the ferromagnetic nanolayer 431. The first CoB layers 412A, 432A are proximate the barrier layer 420. The second CoB layers 412B, 432B are away from the barrier layer 420. The first CoB layers 412A, 432A each has a thickness T1 larger than a thickness T2 of the respective second CoB layer 412B, 432B. In certain embodiments, the first CoB layers 412, 432A each independently has a thickness T1 from about 1.5 times to about 3 times larger than a thickness T2 of the respective second CoB layer 412B, 432B. The first CoB layers 412A, 432A and the second CoB layers 432A, 432B each independently comprises CoB with an atomic percent of B from about 5% to about 50%. The CoB bilayers 412, 432 have low magnetostriction in comparison to other bilayers comprising Fe or Fe alloys, such as FeB or CoFeB. In certain aspects, the low magnetostriction of the CoB bilayers 412, 432 reduce the noise of the magnetoresistive signal providing a higher signal-to-noise ratio (SNR) in comparison to insertion layers with high magnetostriction. In certain aspects, the low magnetostriction of the CoB bilayers 412, 432 increases the reliability of the magnetoresistive device 400 due to reduced deformation and/or delamination of layers in comparison to bilayers with high magnetostriction. The first CoB layer 412A, 432A proximate the barrier layer 420 tends to have more negative magnetostriction. To further control the magnetostriction of the free layers 410, 430, the thickness T1 of each of the first CoB layers 412A, 432A proximate the barrier layer 320 is independently larger than the thickness T2 of the respective second CoB layer 412B, 432B. In certain aspects, the large thickness T1 of the first CoB layers 412A, 432A provides a negative magnetostriction to balance out the positive magnetostriction of the CoFe ferromagnetic nanolayers 413, 431 so that the overall magnetostriction of each of the free layers 410, 430 is low or zero to further increase SNR and/or to further increase reliability.

The amorphous insertion layers 414, 434 each breaks up the columnar grains of the respective bilayer 412, 432 reducing the coercivity of the respective bilayer 412, 432. The amorphous insertion layers 414, 434 each independently comprises CoHf with an atomic percent content of Hf from about 5% to about 95%. In certain embodiments, the amorphous insertion layers 414, 434 each independently comprises ferromagnetic CoHf with an atomic percent content of Hf from about 5% to about 30%. In other embodiments, the amorphous insertion layers 414, 434 are each independently selected from a group consisting of CoHf, CoFeHf, CoFeTa, CoFeB, CoFeBHf, CoFeBTa, Ta, and Hf. In certain embodiments, the amorphous insertion layers 414, 434 are each formed to a thickness from about 2 Å to about 20 Å, such as from about 2 Å to about 6 Å.

The seed layer 402, the buffer layer 404, the barrier layer 420, and the capping layer 440 can be any suitable material. For example, the seed layer 402 can comprise a magnetic material to functionally act as part of the lower shield S1 with fixed magnetization. Examples of magnetic materials of the seed layer 302 include NiFe, CoFe, CoFeB, other magnetic materials, and combinations thereof. For example, the buffer layer 404 can comprise a non-ferromagnetic material that separates the dual free layer from the fixed mixed magnetization of the lower shield S1. Examples of non-ferromagnetic materials include single or multiple layers of a material selected from Ta, Ti, Cr, Ru, Hf, Cu, Ag, other suitable non-ferromagnetic materials, and combinations thereof. For example, the barrier layer 420 can comprise an electrically insulating material of MgO, AlOx, TiOx, or other suitable electrically insulating materials. In certain embodiments, the barrier layer 420 is formed to a thickness of about 10 Å or less. In certain embodiments, the barrier layer is MgO due to the promotion of (001) texture from the ferromagnetic nanolayers 413, 431. For example, the capping layer 440 can comprise a non-ferromagnetic material that separates the dual free layer from the fixed mixed magnetization of the upper shield S2. Examples of non-ferromagnetic materials include single or multiple layers of a material selected from Ta, Ti, Cr, Ru, Hf, Cu, Ag, other suitable non-ferromagnetic materials, and combinations thereof.

Due to a narrow read gap between the shields (S1, S2) to achieve reading of high recording densities, the free layers 410, 430 each has a thickness of about 100 Å or less in certain embodiments to form a narrow read gap sensor. A narrow read gap sensor requires free layers 410, 430 each with a high magnetic moment. Free layers of CoFeB have a desirable high magnetic moment and an undesirable high coercivity. The amorphous insertion layers 414, 434 between the respective bilayer 412, 432 each provides a desirable high magnetic moment and a desirable low coercivity. To further increase the magnetic moments of the free layers 410, 430, the free layers 410, 430 each comprises a ferromagnetic nanolayer 413, 431, such as a CoFe ferromagnetic nanolayer, which undesirably has a high magnetostriction. The magnetostriction of the free layers 410, 430 is tunable by varying the thicknesses of each of the respective first and the second CoFeB layers 412A-B, 432A-B. For example, free layers 410, 430 each with low or zero magnetostriction contributes to a read sensor with higher SNR and/or with high reliability.

The magnetoresistive device 300, 400 of FIGS. 3A-B or FIGS. 4A-B can be shaped and incorporated with other soft bias and/or hard bias elements to form a read sensor. In one embodiment, a magnetoresistive device 400 comprising a dual free layers with side shield soft bias elements and a rear hard bias stabilization comprises tuned magnetostriction of each of the free layers to tune the bias point for each of the free layers to increase SNR of the device.

The magnetoresistive device 300, 400 of FIGS. 3A-B or FIGS. 4A-B can be applicable to tunneling magnetoresistive (TMR) and/or to giant magnetoresistive (GMR) devices. The magnetoresistive device 300, 400 of FIGS. 3A-B or FIGS. 4A-B is described herein as comprising a "layer." It is understood that as used herein, the term "layer" means a single layer or multiple sub-layers. For example, a metal alloy layer can be one or more sub-layers comprising a metal alloy, can be multiple sub-layers of single metals, or combinations thereof.

Due to a narrow read gap of a read sensor, the thickness of a free layer of the read sensor is limited to a certain dimension. In certain embodiments, a free layer comprising a bilayer (e.g., a first and a second CoFeB layer) with an amorphous insertion layer in between the bilayer. The free layer includes a ferromagnetic nanolayer between the CoFeB bilayer and a barrier layer. In certain embodiments, the ferromagnetic nanolayer comprises CoFe with an atomic percent content of Fe from about 50% to about 70%. The magnetostriction of the free layer is tunable by varying the thicknesses of each of the first and the second CoFeB layers. The free layer can be part of a magnetoresistive device with a reference layer or with another free layer. In certain embodiments, the free layer has a thickness of about 100 Å or less. In certain embodiment, the certain embodiments, the free layer has a magnetic saturation moment (Bs) of about 1 Tesla or greater. In certain embodiments, the free layer has a coercivity (Hc) of about 3 Oe or less and with an induced coupling (Hint) of 150 Oe or less. In certain embodiments, the free layer has a magnetostriction of an absolute value of $5 \times 10^{-7}$ or less.

In one embodiment, a magnetoresistive device includes a barrier layer, a free layer, and a capping layer. The free layer is on the barrier layer. The free layer includes a ferromagnetic nanolayer, a first layer, an amorphous insertion layer, a second layer. The ferromagnetic nanolayer is on the barrier layer. The first layer is proximate the barrier layer and is on or over the ferromagnetic nanolayer. The amorphous insertion layer is between the first layer and the second layer. The second layer is away from the barrier layer and on the amorphous insertion layer. Each of the first layer and the second layer independently comprises a material selection from CoFeB and CoB. The first layer has a thickness from about 0.1 times to about 10 times a thickness of the second layer. The capping layer comprises a non-ferromagnetic material is over the free layer.

In another embodiment, a magnetoresistive device includes a seed layer, a buffer layer, a first free layer, a barrier layer, and a second free layer. The buffer layer is over the seed layer. The first free layer is over the buffer layer. The barrier layer is over the first free layer. The second free layer is over the barrier layer. Each of the first free layer and the second free layer independently comprises a ferromagnetic nanolayer, a first layer, an insertion layer, and a second layer. Each of the ferromagnetic nanolayers is adjacent the barrier layer. Each of the first layers is proximate the barrier layer. Each of the insertion layers is between the first layer and the second layer. Each of the second layers is away from the barrier layer and on the insertion layer. Each of the first layers independently has a thickness from about 0.1 times to about 10 times a thickness of the respective second layer. Each of the first layer and the second layer of each of the first free layer and the second free layer independently comprises a material selected from CoFeB and CoB.

In still another embodiment, a magnetoresistive device includes a MgO barrier layer, a free layer, and a capping layer. The free layer is over the MgO barrier layer. The free layer includes a CoFe nanolayer, a first layer, a CoHf insertion layer, and a second layer. The CoFe nanolayer is on the MgO barrier layer. The first layer proximate is on the CoFe nanolayer. The CoHf insertion layer is between the first layer and the second layer. The second layer is on the CoHf insertion layer. The capping layer is on the free layer.

Each of the first layer and the second layer independently comprises a material selected from CoFeB and CoB. The first layer has a thickness from about 0.1 times to about 10 times a thickness of the second layer. The free layer has a thickness of about 100 Å or less.

EXAMPLES

The Examples are not meant to limit the scope of the claims unless expressly recited as part of the claims.

Example 1

Figure 5:
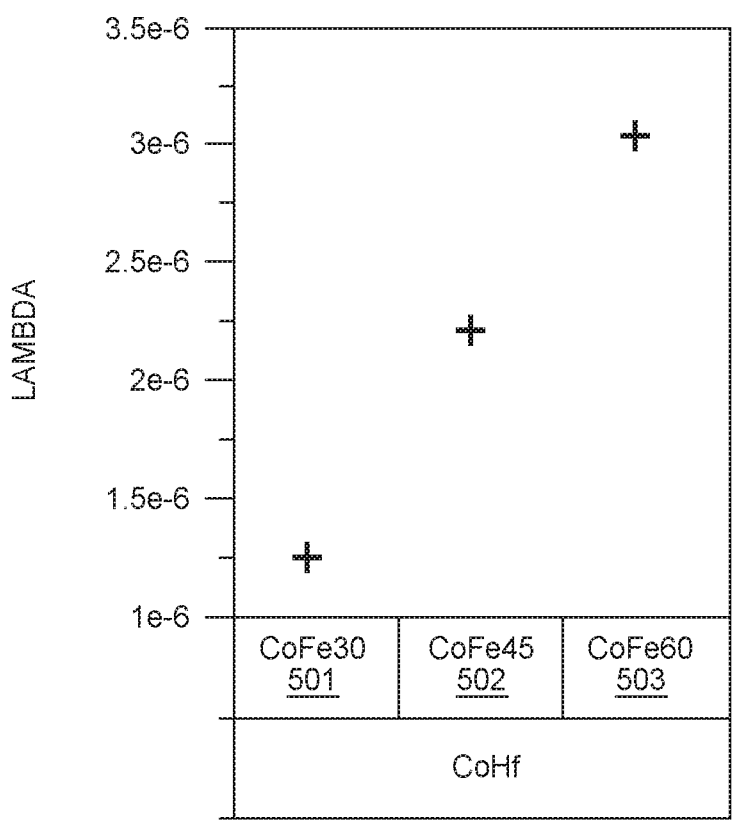
FIG. 5 is a chart of magnetostrictions of various samples of read sensors.

The magnetostriction of various samples of read sensors were measured and plotted in the chart of FIG. 5. Each of the samples comprised a CoFe nanolayer, a CoB bilayer, and a CoHf insertion layer. The CoFe nanolayer of Sample 501 comprised CoFe with an atomic percent content of Fe of 30%. The CoFe nanolayer of Sample 502 comprised CoFe with an atomic percent content of Fe of 45%. The CoFe nanolayer of Sample 503 comprised CoFe with an atomic percent content of Fe of about 60%. The TMR signal of Sample 503 was about 10% higher than the TMR signal of Sample 501. The magnetostriction (lamda) of Sample 503 was higher than magnetostrictions of Sample 501 and Sample 502.

Example 2

Figure 6:
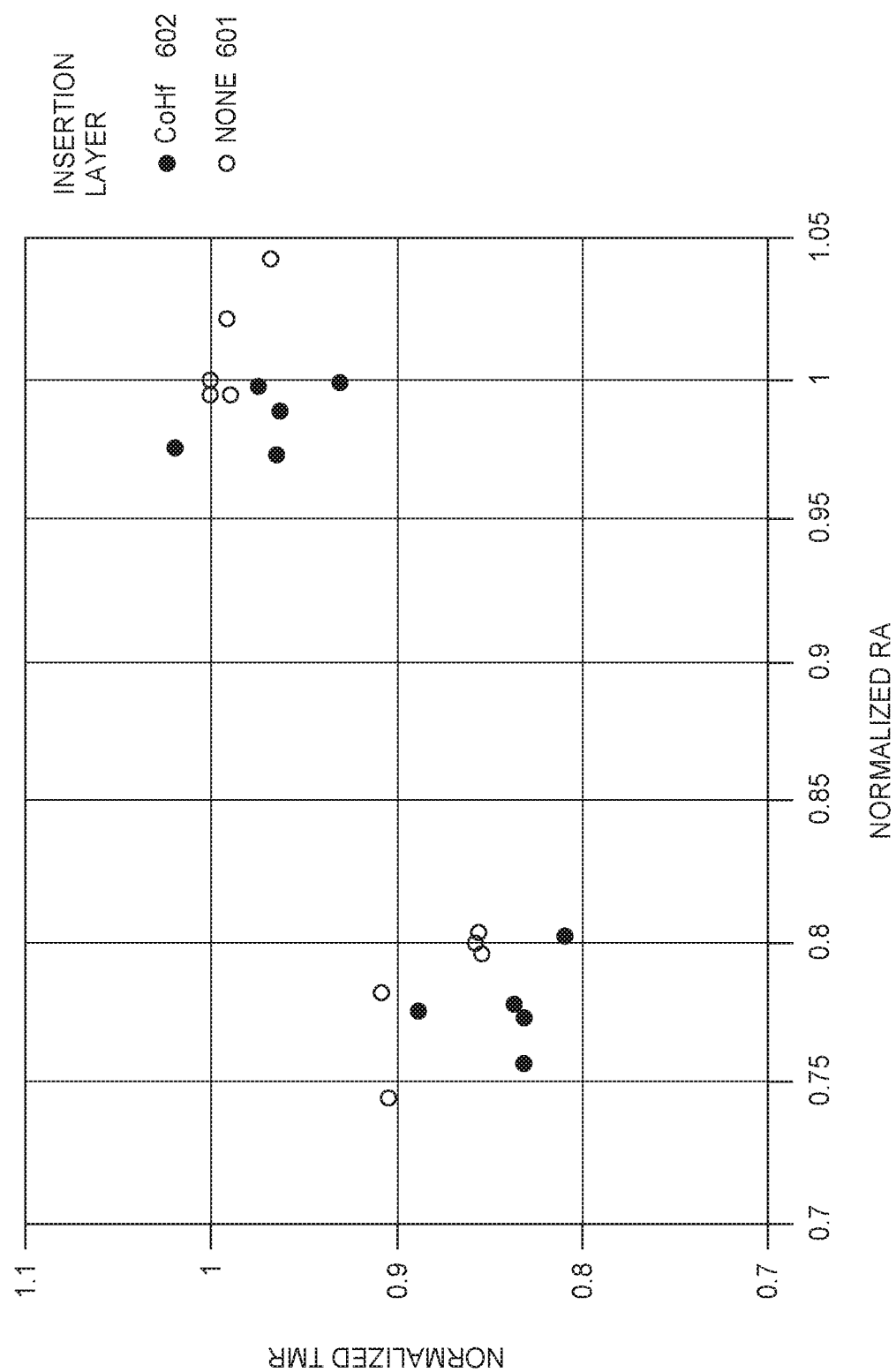
FIG. 6 is a chart of TMR ratio signals of various samples of read sensors.

Normalized TMR ratio (%) signals versus normalized resistance area products of various samples of read sensors were measured and plotted in the chart of FIG. 6. Each of the samples comprised a CoFe nanolayer and a CoB free layer. The CoB free layers of Samples 601 did not include any insertion layers. The CoB free layers of Samples 602 included CoHf insertion layers. Both Samples 601 and 602 showed high TMR signals.

Example 3

Figure 7:
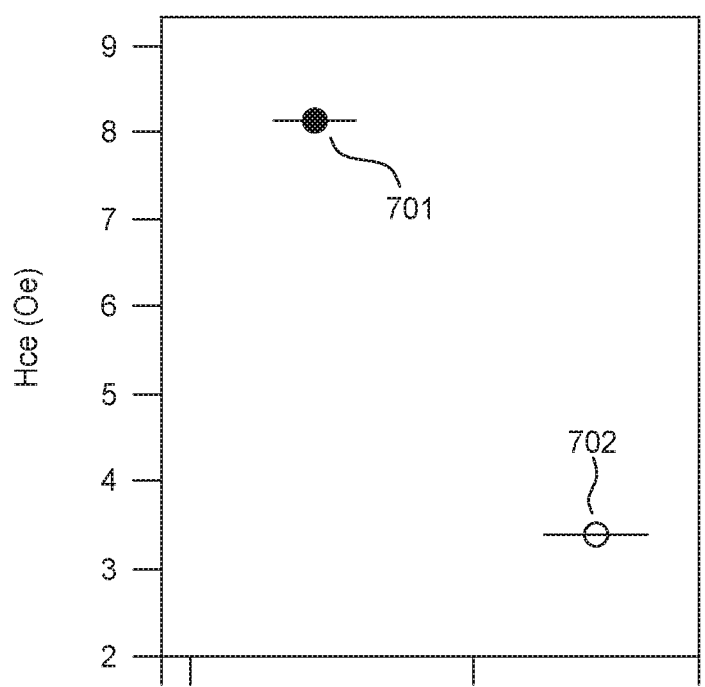
FIG. 7 is a chart of coercivities of various free layers.

The coercivity of various samples of free layers were measured and plotted in the chart of FIG. 7. Sample 701 comprised a CoB free layer without any insertion layer. Sample 702 comprised a CoB free layer including a CoHf insertion layer. Sample 702 showed low coercivity while Sample 701 showed high coercivity.

While the foregoing is directed to embodiments of the present disclosure, other and further embodiments of the disclosure may be devised without departing from the basic scope thereof, and the scope thereof is determined by the claims that follow.

What is claimed is:

1. A magnetoresistive device, comprising:
a barrier layer;
a free layer over the barrier layer, the free layer comprising:
   a ferromagnetic nanolayer on the barrier layer;
   a first layer proximate the barrier layer and over the ferromagnetic nanolayer;
   a second layer away from the barrier layer and over the first layer; and
   an amorphous insertion layer between the first layer and the second layer; and
a non-ferromagnetic capping layer over the free layer,
wherein each of the first layer and the second layer independently comprises a material selected from CoFeB and CoB,
wherein the first layer has a thickness from about 1.5 times to about 10 times a thickness of the second layer.

2. The magnetoresistive device of claim 1, wherein the free layer has a thickness of about 100 Å or less.

3. The magnetoresistive device of claim 1, wherein the amorphous insertion layer comprises CoHf.

4. The magnetoresistive device of claim 1, wherein the ferromagnetic nanolayer comprises CoFe.

5. The magnetoresistive device of claim 1, wherein each of the first layer and the second layer independently comprises CoFeB with Fe in an atomic percent of about 60% or less.

6. The magnetoresistive device of claim 1, wherein the first layer has a thickness from about 1.5 times to about 3 times larger than a thickness of the second layer.

7. A magnetic media drive comprising a read sensor comprising the magnetoresistive device of claim 1.

8. A magnetoresistive device, comprising:
a seed layer;
a buffer layer over the seed layer;
a first free layer over the buffer layer,
a barrier layer over the first free layer;
a second free layer over the barrier layer;
the first free layer comprising:
   a ferromagnetic nanolayer adjacent the barrier layer;
   a first layer proximate the barrier layer; and
   a second layer away from the barrier layer; and
   an insertion layer between the first layer and the second layer; and
the second free layer comprising:
   a ferromagnetic nanolayer on the barrier layer;
   a first layer proximate the barrier layer; and
   a second layer away from the barrier layer; and
   an insertion layer between the first layer and the second layer; and
a non-ferromagnetic capping layer over the second free layer,
wherein the first layer of the first free layer has a thickness from about 0.1 times to about 10 times a thickness of the second layer of the first free layer,
wherein the first layer of the second free layer has a thickness from about 0.1 times to about 10 times a thickness of the second layer of the second free layer,
wherein each of the first layer and the second layer of each of the first free layer and the second free layer independently comprises a material selected from CoFeB and CoB.

9. The magnetoresistive device of claim 8, wherein the first free layer and the second free layer each independently has a thickness of about 100 Å or less.

10. The magnetoresistive device of claim 8, wherein the insertion layer of each of the first free layer and the second free layer comprises CoHf.

11. The magnetoresistive device of claim 8, wherein the ferromagnetic nanolayer each of the first free layer and the second free layer comprises CoFe.

12. The magnetoresistive device of claim 8, each of the first layer and the second layer of each of the first free layer and the second free layer independently comprises CoFeB with Fe in an atomic percent of about 60% or less.

13. The magnetoresistive device of claim 8, wherein the first layer of the first free layer has a thickness from about 1.5 times to about 3 times larger than a thickness of the second layer of the first free layer, and wherein the first layer of the second free layer has a thickness from about 1.5 times to about 3 times larger than a thickness of the second layer of the second free layer.

14. A magnetic media drive comprising a read sensor comprising the magnetoresistive device of claim 8.

15. A magnetoresistive device, comprising:
  a MgO barrier layer;
  a free layer over the MgO barrier layer, the free layer comprising:
    a CoFe nanolayer on the MgO barrier layer;
    a first layer proximate the MgO barrier layer and over the CoFe nanolayer;
    a second layer away from the MgO barrier layer and over the first layer; and
    a CoHf insertion layer between the first layer and the second layer; and
  a capping layer over the free layer,
  wherein each of the first layer and the second layer independently comprises a material selected from CoFeB having an atomic percent of Fe of about 60% or less and CoB having an atomic percentage of B of about 5% to about 50%,
  wherein the first layer has a thickness from about 0.1 times to about 10 times a thickness of the second layer,
  wherein the free layer has a thickness of about 100 Å or less.

16. The magnetoresistive device of claim 15, wherein the first layer has a thickness from about 1.5 times to about 3 times larger than a thickness of the second layer.

17. The magnetoresistive device of claim 15, wherein the free layer has a magnetic saturation moment (Bs) of about 1 Tesla or greater.

18. The magnetoresistive device of claim 15, wherein the free layer has a coercivity (Hc) of about 3 Oe or less and with an induced coupling (Hint) of 150 Oe or less.

19. The magnetoresistive device of claim 15, wherein the free layer has a magnetostriction of an absolute value of $5 \times 10^{-7}$ or less.

20. A magnetic media drive comprising a read sensor comprising the magnetoresistive device of claim 15.

* * * * *